United States Patent
Vadde et al.

(10) Patent No.: US 7,539,269 B2
(45) Date of Patent: May 26, 2009

(54) METHOD AND APPARATUS FOR DISCRETE POWER SYNTHESIS OF MULTICARRIER SIGNALS WITH CONSTANT ENVELOPE POWER AMPLIFIERS

(75) Inventors: Venkatesh Vadde, Bangalore (IN); Kiran Kuchi, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/567,629

(22) PCT Filed: Aug. 6, 2004

(86) PCT No.: PCT/US2004/025397

§ 371 (c)(1),
(2), (4) Date: Jan. 8, 2007

(87) PCT Pub. No.: WO2005/015732

PCT Pub. Date: Feb. 17, 2005

(65) Prior Publication Data

US 2007/0098109 A1 May 3, 2007

(51) Int. Cl.
*H04L 27/00* (2006.01)
*H04K 1/02* (2006.01)

(52) U.S. Cl. ............... 375/297; 375/295; 375/296; 330/295; 330/296

(58) Field of Classification Search .......... 375/295, 375/146, 296, 297; 330/295, 296
See application file for complete search history.

(56) References Cited

U.S. PATENT DOCUMENTS

| | | | | |
|---|---|---|---|---|
| 4,598,252 A | * | 7/1986 | Andricos | 330/51 |
| 5,831,479 A | * | 11/1998 | Leffel et al. | 330/124 D |
| 5,834,975 A | * | 11/1998 | Bartlett et al. | 330/278 |
| 5,974,041 A | * | 10/1999 | Kornfeld et al. | 370/342 |
| 5,986,500 A | * | 11/1999 | Park et al. | 330/124 D |
| 5,999,046 A | * | 12/1999 | Kotzamanis | 330/124 R |
| 6,137,355 A | * | 10/2000 | Sevic et al. | 330/51 |
| 6,148,040 A | * | 11/2000 | Nguyen et al. | |
| 6,255,906 B1 | * | 7/2001 | Eidson et al. | 330/124 R |
| 6,313,703 B1 | * | 11/2001 | Wright et al. | 330/149 |
| 6,359,504 B1 | * | 3/2002 | Cozzarelli | 330/51 |
| 6,463,269 B2 | * | 10/2002 | DeMarco | 455/341 |
| 6,567,477 B1 | | 5/2003 | Feldman et al. | 375/295 |
| 6,593,827 B2 | | 7/2003 | Chethik et al. | 332/103 |
| 6,798,295 B2 | * | 9/2004 | Pengelly et al. | 330/124 R |
| 6,922,102 B2 | * | 7/2005 | Myer et al. | 330/295 |
| 7,020,215 B2 | * | 3/2006 | Porco et al. | 330/51 |

(Continued)

*Primary Examiner*—Jason M. Perilla
(74) *Attorney, Agent, or Firm*—Harrington & Smith, PC (57) ABSTRACT

A power synthesizer is in several (n) discrete stages, each stage having a discrete amplitude, constant envelope amplifier coupled in series with a continuous phase modulator. Each modulator is actuated simultaneously, but not necessarily to modulate the signal phase similarly. For circuit power combining, the modulators are coupled to inputs of the amplifiers, while the separately modulated and amplified bits are combined prior to being fed to the antenna. For spatial power combining, each modulator is coupled to the input of an amplifier which in turn feeds one of several antennas. Each stage operates on one bit, and each successive $n^{th}$ stage amplifies the input bit by a factor of $a0/2^{n-1}$. Preferably, a discrete amplitude generator converts an (analog) output of an IFFT block to a binary sequence, and each bit is fed to a separate stage. The power synthesizer converts a digital output of the discrete amplitude generator to analog at RF rather than at baseband, rendering a baseband DAC, and a separate upconverter, unnecessary.

34 Claims, 7 Drawing Sheets

U.S. PATENT DOCUMENTS

| | | | |
|---|---|---|---|
| 7,119,621 B2* | 10/2006 | Chen et al. | 330/295 |
| 7,151,913 B2* | 12/2006 | Ahmed | 455/91 |
| 2002/0168013 A1 | 11/2002 | Attallah et al. | 375/259 |
| 2002/0172184 A1 | 11/2002 | Kim et al. | 370/344 |
| 2003/0076167 A1 | 4/2003 | Hellberg | 330/124 |
| 2003/0095012 A1* | 5/2003 | Chethik et al. | 332/103 |
| 2003/0132800 A1* | 7/2003 | Kenington | 330/124 R |
| 2003/0152023 A1* | 8/2003 | Hosur et al. | 370/208 |
| 2004/0113697 A1* | 6/2004 | Pengelly et al. | 332/103 |
| 2004/0189380 A1* | 9/2004 | Myer et al. | 330/295 |

* cited by examiner

METHOD AND APPARATUS FOR DISCRETE POWER SYNTHESIS OF MULTICARRIER SIGNALS WITH CONSTANT ENVELOPE POWER AMPLIFIERS

FIELD OF THE INVENTION

This invention pertains in general to communication systems. In particular, embodiments of the invention pertain to discrete power synthesis of multicarrier signals such as OFDM or MC-CDMA.

BACKGROUND

Figure 1:
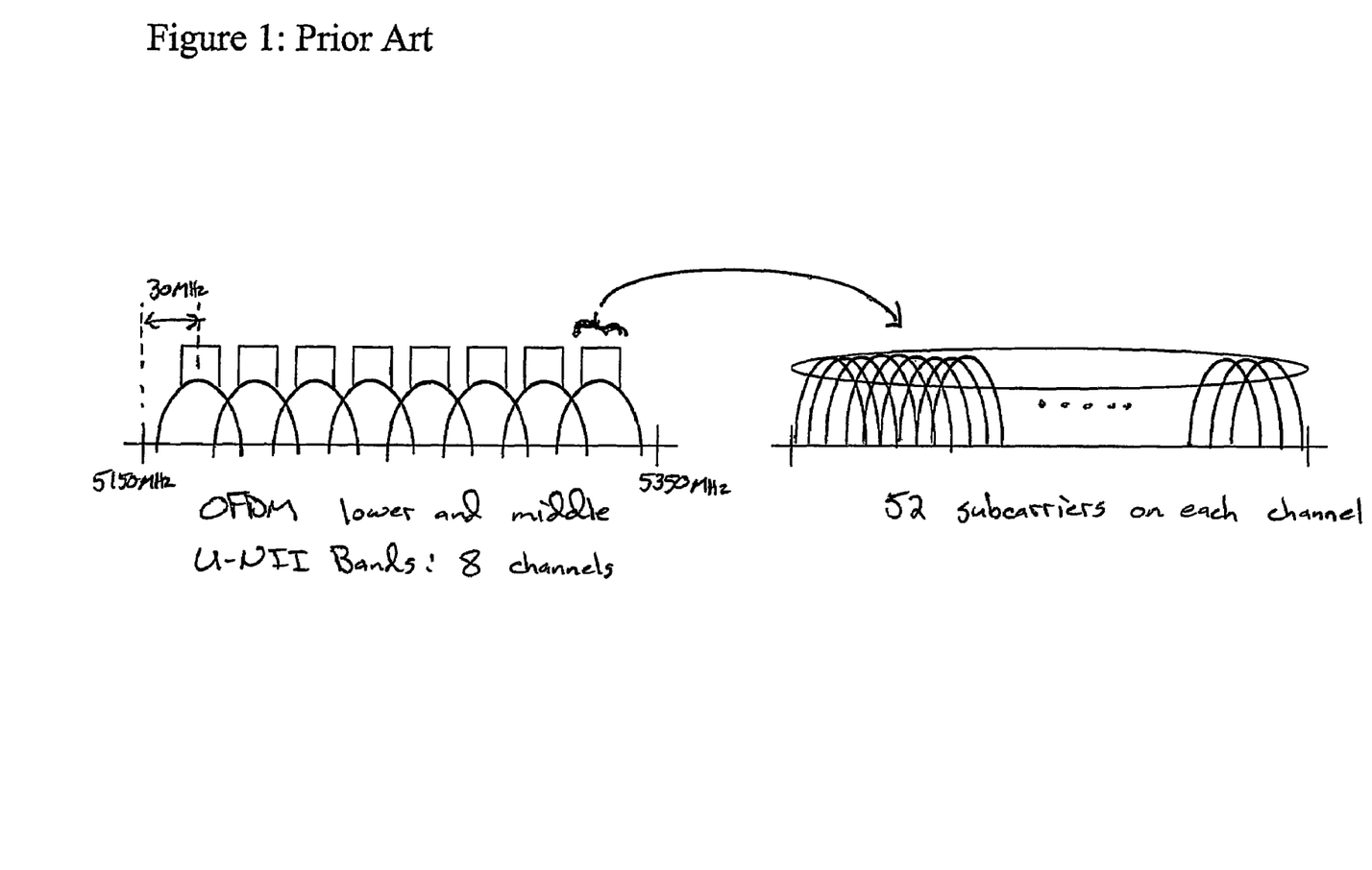
FIG. 1 is a prior art schematic diagram showing spectrum allocation and subcarriers in an OFDM system.

Multicarrier systems hold great potential to provide high bit-rates in multipath fading channels. The ability of such systems to robustly handle multipath and their dramatically simple equalizer structures have made multicarrier modulation a preferred choice in contemporary communication systems. Already two strong contenders for 4G systems are based on multicarrier modulation: MIMO-OFDM and MC-CDMA. Even recent generations of other technologies have relied heavily on multicarrier signals, including OFDM as specified in the United States under IEEE 802.11a. Similar multicarrier regimens are specified in Japan by the ARIB MMAC group, and in Europe by the ETSI workgroup BRAN as HIPERLAN, each operating in the 5 GHz range and enabling user-selectable data rates of up to 54 Mbits/sec. A conceptual diagram of an OFDM system according to 802.11a is shown in FIG. 1. Between the frequencies of 5150 and 5350 MHz are eight non-overlapping orthogonal channels (for the two lower bands). Each of those channels is divided into 52 subcarriers, each occupying 312.5 kHz of bandwidth. Four of those subcarriers carry "pilot tones" that do not carry transmit data but are instead used to aid in coherent demodulation of the signal at the receiver, leaving 48 subcarriers to carry the user information. Whether OFDM or MC-CDMA, the underlying theme for multicarrier communication is usually centered around synchronous addition of several subcarriers. The signal obtained by coherent addition of several subcarriers (hence, multicarrier) is transmitted such that the receiver can demodulate individual subcarriers rather easily. The ease of demodulation is ensured either by inherent orthogonality of the subcarriers (where a subcarrier might represent an individual user) or by orthogonal Walsh codes, such as used in CDMA.

An important goal of multicarrier system research is to devise methods to efficiently handle signals with a large dynamic range. It is common to quantify the signal's dynamic range in terms of the peak to average power ratio (PAR). Typically, a high PAR results from the occasional (but unpredictable) coherent addition of subcarriers leading to instantaneous peaks. Moderate power levels may be readily handled by the RF power amplifier (PA) of the prior art, but the occasional peak powers pose severe problems. A high input signal PAR forces the RF power amplifier (RFPA) to operate at several dBs of output power backoff, leading to undesirably low efficiencies. The PAR problem is generally more pronounced in multi-carrier systems because it is directly impacted by the bandwidth of the system. For example, the PAR in an OFDM system is proportional to the number of subcarriers N, and larger numbers of subcarriers N (for a given subcarrier spacing), result in larger system bandwidth. The PAR problem appears to be inherent to all multicarrier modulated systems such as OFDM because the multiple subcarriers can add together constructively to create a very large signal, or destructively to create a very small signal. The wide variation makes for a challenging power amplifier design, as distortion must be minimized while keeping the average power low enough to accommodate the large peaks.

A reduced PAR and higher power efficiency is especially desirable in mobile devices because it would directly reduce power requirements. This could result in a significant reduction in power consumption, an important consideration for portable devices that rely on batter power. It may also enhance the user experience where reduced power consumption yields a noticeable reduction in heat dissipation through the handheld device. The traditional approach to RFPA design for managing high PAR has been to innovate single-transistor amplifiers with progressively higher power rating, which generally results in further challenges to maintain amplifier linearity.

Regardless of the specific approach, prior art efforts to reduce PAR generally come at a cost of increased bandwidth or lower data throughput. One common method used in the prior art to reduce PAR is to clip the signal any time the envelope amplitude exceeds a clipping threshold. This technique carries two disadvantages: signal fidelity is reduced because signal energy is discarded each time the peak-valued signal samples are clipped; and clipping is necessarily an amplitude compression technique that leads to bandwidth expansion in the frequency domain (though the expansion is subtle). Additionally, the effectiveness of clipping is inversely proportional to the order of modulation, so clipping a 64-QAM signal is less effective than clipping a 16-QAM signal.

Companding, which generally comprises amplitude compression followed by expansion, is another method to reduce system PAR. Even more so than clipping, companding improves the PAR at the expense of bandwidth. Because companding results in much higher expansion of bandwidth as compared to clipping techniques, it is not very amenable to systems using multipath transmission channels due to the increased bandwidth that multicarrier systems employ, as noted above. Other attempts to reduce PAR include using block codes to modulate the subcarriers rather than using the data directly, and to restrict the subcarrier modulation schemes to some defined phase and amplitude relationship. These approaches generally result in a bandwidth cost. For example, in the case of coding methods, the increased bandwidth cost is exhibited as a reduction in coding rate for the system. What is needed in the art is a method and apparatus to reduce PAR in a multicarrier system without increasing bandwidth or losing data throughput.

SUMMARY OF THE INVENTION

An OFDM signal normally suffers from large peak to average power ratios (PAR) forcing the RF power amplifier (PA) to operate in back-off modes. This problem is hard to solve especially when the RFPA comprises a single device. This invention makes it possible to use several devices combined at the device level or circuit level, making some allowances in the representation of the OFDM signal amplitude. One embodiment of the invention is a suitable combination of discrete amplitude, constant envelope amplifiers that can achieve BER performance comparable to normal class-A linear amplifiers. Overall, the aggregate device peripheries of certain embodiments of the present invention do not exceed existing device peripheries, and high efficiency multicarrier transmission may be obtained by sacrificing some limited SNR in system performance.

Specifically, the present invention is in one aspect a power synthesizer having a first and second stage in parallel with one another. Each stage has a discrete amplitude amplifier and a modulator in series with one another. The power synthesizer further has an actuator for simultaneously switching the first and second modulators. In one embodiment, each stage has an input coupled to an output of a discrete amplitude generator. Preferably, the modulators are continuous phase, such as PAM modulators. In a preferred embodiment, one or more power combiners have parallel inputs coupled to outputs of the constant envelope amplifiers. In an alternative embodiment, one or more modulators have parallel outputs coupled to constant envelope amplifiers, where each amplifier's output is coupled to an antenna. Most advantageously, the modulators are continuous phase, pulse amplitude modulators.

The present invention is in another aspect an improvement on a prior art transmitter for transmitting in a multicarrier communication system. The transmitter has, in series, an encoder, a serial to parallel converter, a parallel to serial converter for outputting a digital signal at baseband, and at least one transmit antenna. The present invention improves upon it in that it adds a power synthesizer block having at least two discrete amplifier stages in parallel, each stage disposed between the parallel to serial converter and the (at least one) transmit antenna. Notable in certain embodiments is an absence of a digital to analog converter disposed between the parallel to serial converter and the power synthesizer block. This aspect may include power combining from the various amplifier stages spatially, as in simultaneous transmission from multiple antennas, or power combining at the circuit level prior to transmission.

In another aspect, the present invention is a method of transmitting a signal on a multicarrier communication channel. In the method, a separate bit of a bit stream is provided on each of n parallel inputs, n being an integer greater than one. For each input, a phase of the input bit is separately controlled. That is not to say the control is separate in time or space; controlling of phase is preferably done simultaneously across all of the bits that are in parallel. What is separate is the control of the phase itself; not all inputs necessarily have their phases identically shifted. Preferably, all phase changes for a series of bits on each of the parallel n input lines do not exhibit a discontinuity. Further in the method, each of the phase-controlled bits is separately amplified at a unique power, the unique power being unique as compared to the power amplification on all other n parallel inputs. The amplified phase controlled bits are transmitted, either following their combination at the circuit level, or simultaneous with the combining such as where the separate signals are transmitted from separate antennas.

These and other features, aspects, and advantages of embodiments of the present invention will become apparent with reference to the following description in conjunction with the accompanying drawings. It is to be understood, however, that the drawings are designed solely for the purposes of illustration and not as a definition of the limits of the invention.

DETAILED DESCRIPTION

The following abbreviations are used throughout this disclosure:
AWGN: additive white Gaussian noise
BER: bit error rate
CMOS: complementary metal oxide semiconductor
DG/MESFET: dual gate/metal semiconductor field effect transistor
DPS: discrete power synthesis
IFFT: inverse fast Fourier transform
LSB/MSB: least significant bit/most significant bit
MC-CDMA: multicarrier code division multiple access
OFDM: orthogonal frequency division multiplexing
PAM: pulse amplitude modulation
PAR: peak to average power ratio
PSD: power spectral density
QPSK: quadrature phase shift keying
RFPA: radio frequency power amplifier
SNR: signal to noise ratio The present invention is in general a discrete power synthesis (DPS) method and apparatus for multicarrier communication systems such as OFDM or MC-CDMA RF signals. In a preferred embodiment, it relies on the combination of several discrete RF amplifiers at the device or circuit level. One important aspect distinguishing this invention over the prior art is that the digital to analog conversion (DAC) of the signal in the transmitter takes place in the RF domain rather than at baseband. DPS according to the present invention preferably uses constant envelope, phase-modulated amplifiers with power efficiencies that are higher than those used in prior art arrangements.

Figure 2:
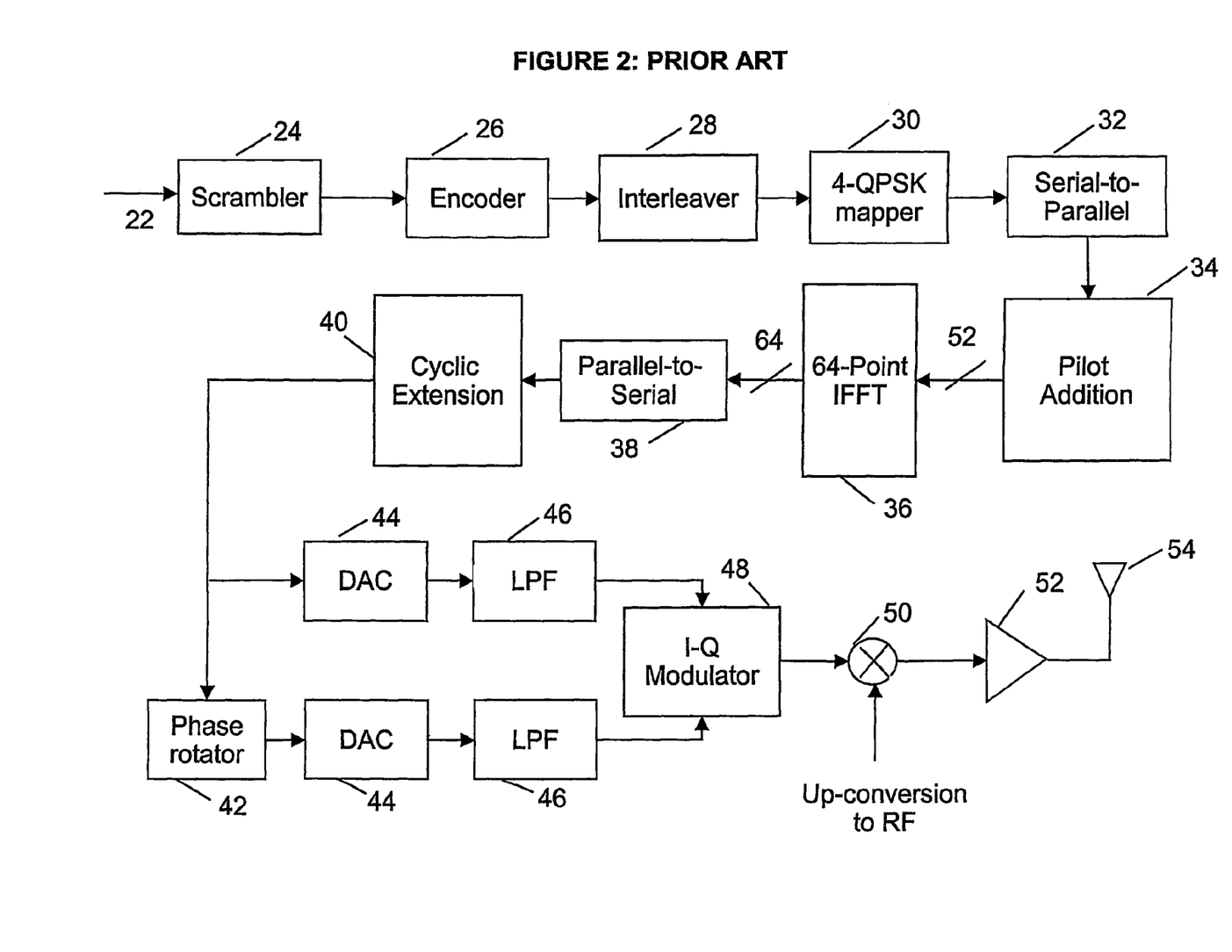
FIG. 2 is a prior art block diagram of a typical transmitter designed for an OFDM communication system.

In order to more clearly distinguish the present invention, FIG. 2 shows in block diagram a prior art transmitter 20 for communicating over a multicarrier OFDM system according to the 802.11a standard. Prior art treatment for a MC-CDMA system is similar in relevant respects. Certain functional blocks, such as spreading code application, that are not relevant to the present invention, are not shown but are known in the art. Binary input bits 22 are assembled into a 48-bit data field (16 service bits, 26 data bits, and 6 tail bits) that are scrambled 24, convolutionally encoded 26, interleaved 30, and mapped to a sequence of 48 QPSK samples for the middle band (BPSK for the lower band and QAM for the upper band). The mapped result is parallelized at a serial to parallel converter 32 so that each sample is modulated onto one of 64 subcarrier outputs, yielding 48 parallel outputs for the 48 bits in the data field. Four pilot samples that are later used to aid with coherent detection are inserted at a pilot addition block 34 to yield 52 parallel outputs. Twelve channels remain empty as the 48-bit plus 4-pilot signal is input into a 64-point IFFT processor 36, and the 64-channel output of the IFFT 36 is serialized at a parallel to serial converter 38. A cyclic extension 40 is appended into the guard interval, where windowing is performed. Cyclic extension makes the system more robust to multipath propagation, while windowing narrows the output spectrum. The serial output with cyclic extension is split into in-phase I and quadrature-phase Q components by a phase rotator 42. Each component passes through a digital to analog converter DAC 44 and a low pass filter LPF 46. The components are combined and modulated to an intermediate frequency IF at an I-Q modulator 48 and up-converted 50 to the 5 GHz band at which the signal will be transmitted. The up-converted signal passes through a power amplifier 52 and is sent over the subchannels via one or more transmit antennas 54. Of note is that in the prior art, a separate DAC-44 is required to convert the digitized samples to analog, and that this conversion is done at baseband prior to power amplification 52.

Figure 3:
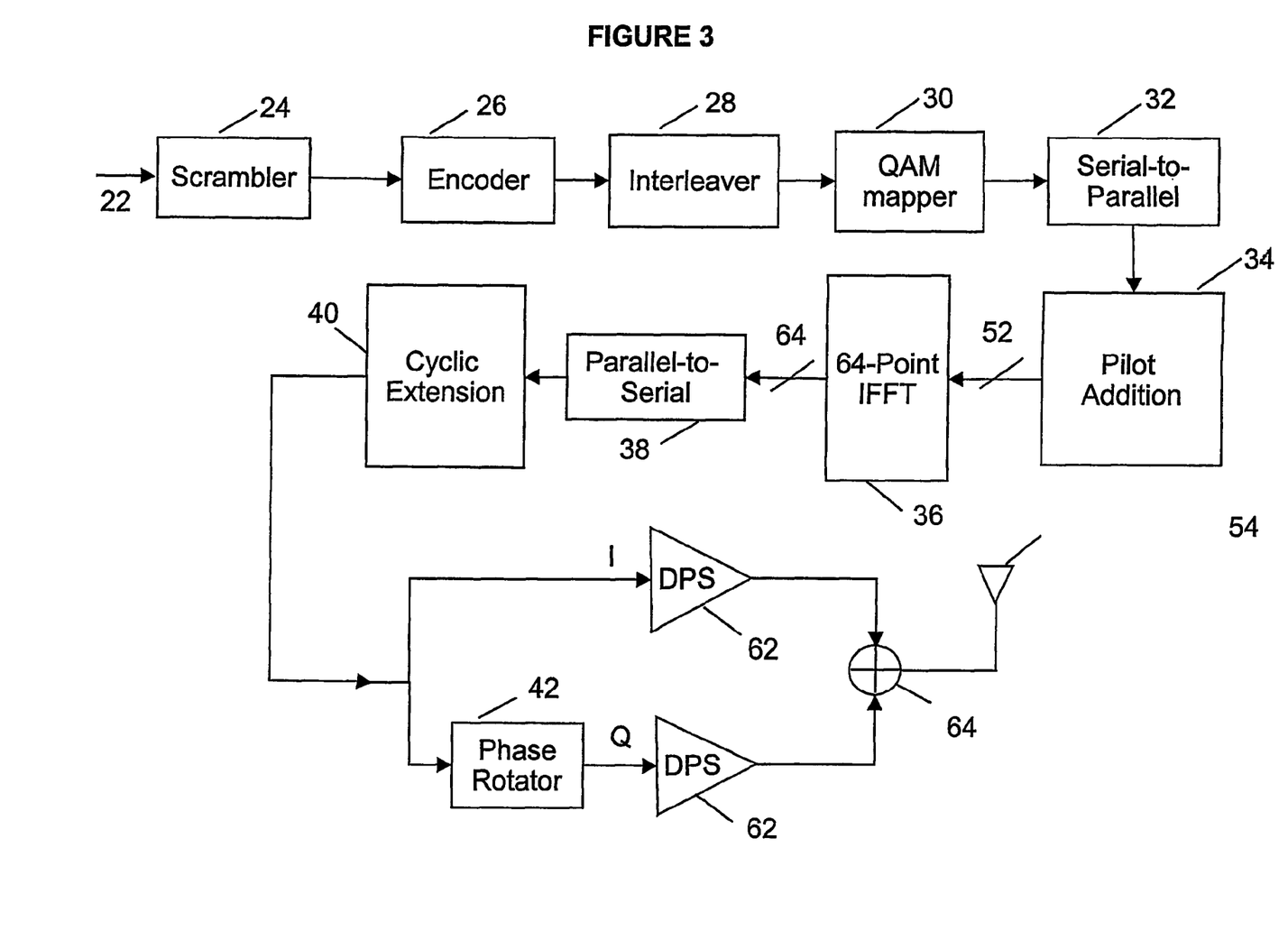
FIG. 3 is a block diagram showing a transmitter for an OFDM communication system according to the preferred embodiment of the present invention.

FIG. 3 is a block diagram of a preferred embodiment of a transmitter 60 according to the present invention for communicating in an OFDM system. Like reference numbers for blocks are similar to those described in FIG. 2, and will not be detailed further except where distinguished. In certain cases, the relative arrangement of the blocks are novel Whereas QAM independently modulates in amplitude a pulse stream and its 90° phase-shifted quadrature component, PAM is generic amplitude modulation of a pulse carrier. The IFFT block 36 converts the input amplitude modulated signal to a bit stream (or a plurality of parallel bit streams). The DPS block 62 is detailed further below with reference to FIG. 4A for the embodiment shown in FIG. 3, and in an alternative arrangement at FIG. 4B. The amplified I and Q streams are added at an adder 64 and transmitted via one or more transmit antennas 54. The signal input into each of the DPS blocks 62 is digital, and preferably at baseband. As will be shown, each DPS block 62 discretely adjusts power on each of several parallel inputs to one of several discrete levels. Adjusting the phase of each of these parallel lines allows an analog output to be defined from a digital input, because coherent addition or subtraction of several discrete values yields a resultant value that is no longer constrained to the discrete power values of the various amplifiers within the DPS blocks 62, and may be considered analog. This operation is detailed further with respect to FIGS. 4A-4B, and it is notable that the DPS 62 of the present invention converts a digital baseband input to an analog output that is upconverted to RF within the DPS block 62.

Figure 4A:
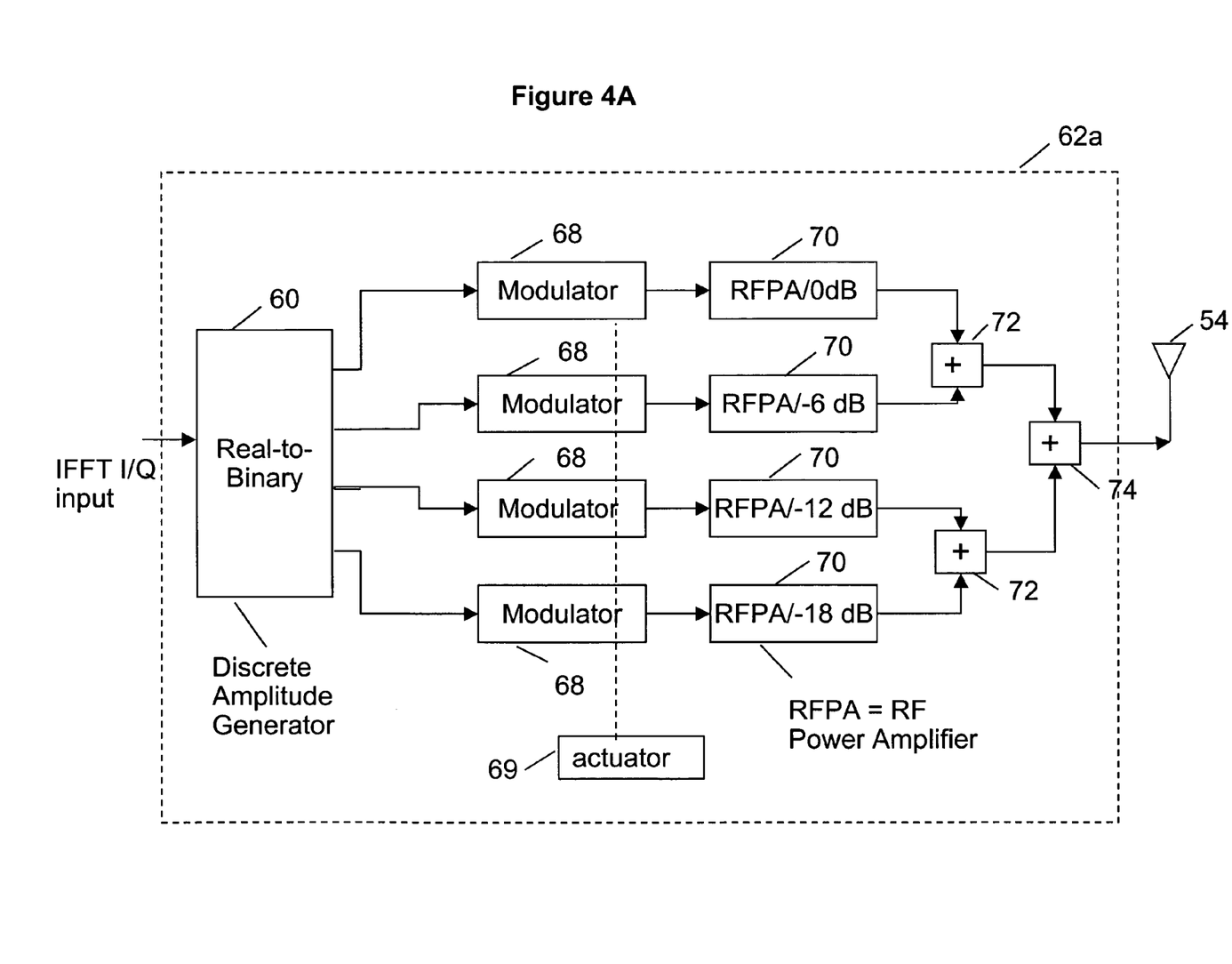
FIG. 4A shows the discrete power synthesizer of FIG. 3 that employs circuit combining in the preferred embodiment of the present invention.

FIG. 4A is a preferred embodiment 62a of the DPS block 62 of FIG. 3. The real input signal from the IFFT 36 (with intervening processing blocks as necessary) is converted to binary and split into four parallel lines at a discrete amplitude generator 66, each of which is input into one of four stages, where each stage includes a modulator 68 in series with a constant envelope amplifier 70. While each of the amplifiers 70 are depicted as a single power amplifier, it is stipulated that each amplifier 70 may include one or several individual active devices, such as FETs, arranged in parallel. Preferably, each separate amplifier 70 is separated by each of its nearest-power amplifier stage by a fixed amount, and most preferably the fixed amount is about six dB. Each modulator 68 is coupled at its output to a power amplifier 70 of the same stage, and all modulators 68 within the preferred DPS 64a toggle in unison by the actuator 69. This is not to imply that the modulators 68 each shift in the same direction. While they may do so in certain instances, they are not bound in all cases to each shift phase in a common direction; to do so would not yield an analog output. They shift simultaneously in a direction dependent upon the amplitude to be synthesized. Preferably, the modulators 68 sample the input bits at a time such that the phase of those input bits is one of only two possible input values, 0 or π. The output of each power amplifier 70 can be considered a "RFbit", where the differential powers applied in the various stages correspond to the most significant bit MSB to the lesser or least significant bit LSB, one in each stage. The phase of each "RF-bit" is shifted according to the amplitude to be synthesized. Preferably, each modulator 68 is a continuous phase pulse amplitude modulator, continuous phase referring to smooth rather than discontinuous phase transitions between states. The shifted "RF-bits" are combined by first level power combiners 72 and second level power combiners 74 until a serial stream of "RF-bits" is assembled for output to one or more transmit antennas 54 (combining with the remaining I or Q stream is not specifically shown in FIGS. 4A or 4B).

The input to the discrete amplitude generator 66 is a near analog input, from the IFFT block 36 (though intermediate processing blocks may be disposed therebetween). The discrete amplitude generator 66 converts that analog or near-analog input to a digital output, though its name is not to imply that it adjusts bit amplitude other than digitizing it. Preferably, the output of the discrete amplitude generator 66 is a binary sequence (e.g., ±1).

Figure 4B:
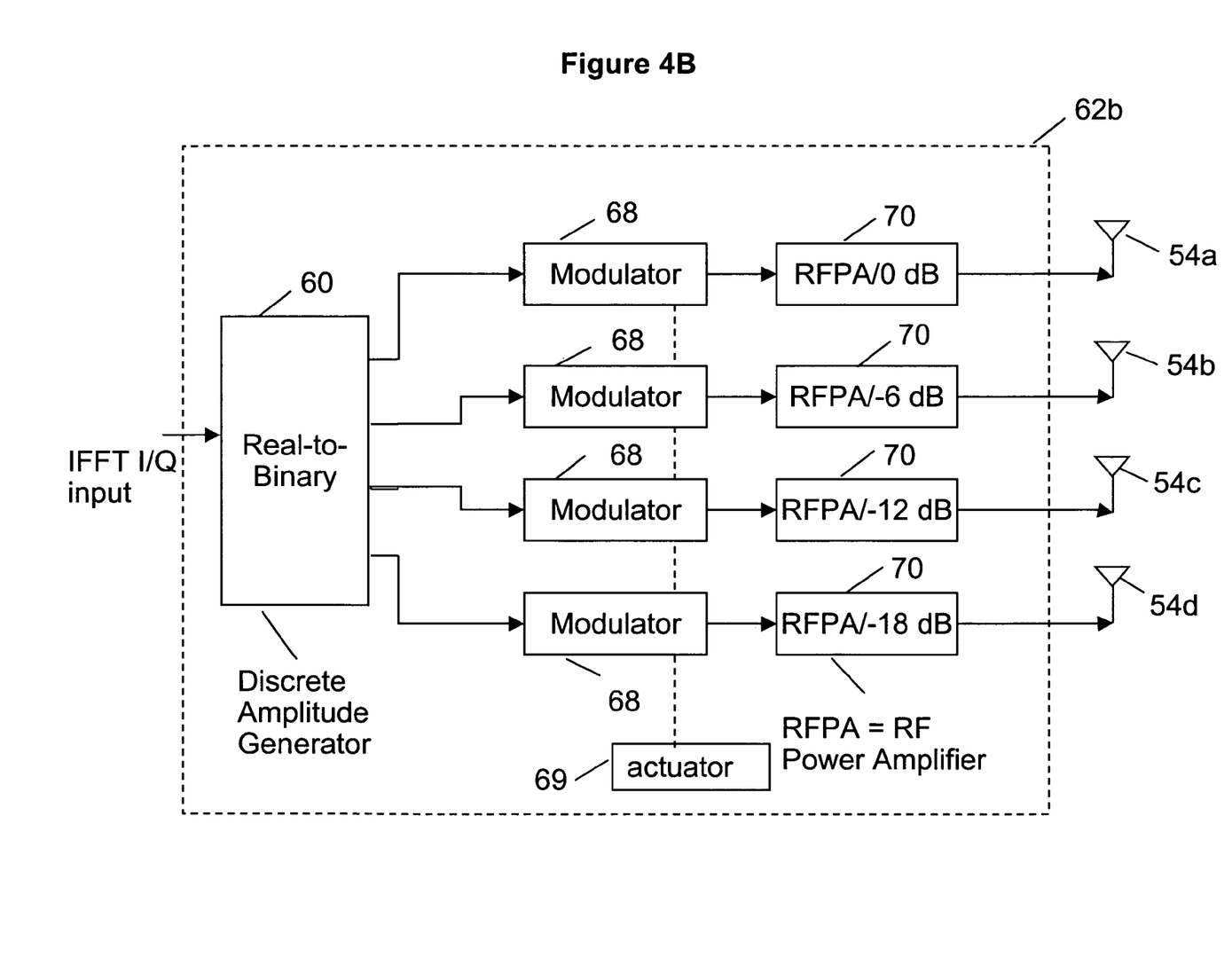
FIG. 4B shows an alternative embodiment of the discrete power synthesizer of FIG. 3 that employs spatial power combining.

An alternative embodiment 62b of the DPS block 62 of FIG. 3 is shown in detail at FIG. 4B. In this embodiment, the single input to the alternative DPS block 62b following the IFFT 36 (and necessary intervening processing blocks) is converted to binary and parallelized into the various stages by the discrete amplitude generator 66 as with FIG. 4A. Each output is to a separate stage that includes a modulator 68 and a constant envelope power amplifier 70. As above, preferably the power amplifiers 70 are separated by 6 dB from their nearest-power neighbor and may each be fabricated from numerous FETs, and the modulators 68 toggle in unison between only two phases. The four outputs of the four power amplifiers 70 of FIG. 4B are each output to a separate transmit antenna 54a-d for transmission. FIG. 4B assumes the transmit antennas 54a-d each have equal gain, which may not be a valid assumption in certain systems. In general, the arrangement of FIG. 4B is termed spatial power combining as power is combined in the spatial domain via simultaneous transmission of different power levels by separate antennas 54a-d.

For either embodiment of FIG. 4A or 4B, each amplifier 70 may be a single discrete device or an array of several field effect transistors FETs, the FET advantage being a more compact size and a lower cost of fabrication (as with all CMOS fabrications, cost advantage is generally realizable only with sufficient volume). Specifically, the 0 dB power amplifier may be realized with an array of 256 FETs having their drains tied together, the −6 dB amplifier may be realized with 128 FETs having their drains tied together, the −12 dB amplifier may be realized with 64 FETs having their gates tied together, and the −18 dB amplifier may be realized with 32 FETs having their gates tied together. Each reduction of 6 dB is realizable with one half the FETs of the amplifier with the next higher power.

Following is a mathematical description of the inventive transmitter 60 described above and in FIGS. 4A-4B. The DPS approach of the present invention is based on the realization that any given signal amplitude can be approximated as a summation of several discrete amplitudes $a_k$ as follows:

$$\tilde{x} = \sum_{k=0}^{k=n} c_k a_k \quad (1)$$

$$c_k = \pm 1 \, a_k = a_0/2^k \quad (2)$$

The maximum amplitude possible from such a synthesizer with n discrete amplifiers or stages would be given by $$x_{max} = 2a_0(1 - 1/2^n) \quad (3)$$

With some approximation, an amplitude synthesizer with n discrete stages can be used to represent an OFDM signal of max amplitude $2a_0$. For example, a five-stage implementation would entail a first amplifier having output $a_0$ and second through fifth amplifiers having respective outputs $a_0/2$, $a_0/4$, $a_0/8$, and $a_0/16$, for a total five-stage output of $31/16 a_0$. An n-stage DPS synthesizer 62 for each of the I & Q signals is preferred so that any complex amplitude is synthesizable. The residual error signal, $x_{res} = x - \tilde{x}$ could be added, if so desired, to the n-stage synthesized signal to make the representation exact. The advantage of such an n-stage DPS synthesis lies in the use of constant envelope, phase modulated amplifiers 70. Since all such component devices 70 will be of high efficiency, the composite DPS synthesizer 62 can potentially deliver high power efficiencies. Furthermore, by employing sufficient number of such devices 68 and 70, it is possible to achieve very high PAR values using n-stage synthesis.

Consider FIGS. 4A-B. So long as the modulators 68 (or digital phase shifters) may be toggled in unison to coherently add or subtract the RF field, it is possible to achieve any desired instantaneous amplitude (hence, power). The insertion loss of the power combiners 72, 74 (FIG. 4A) must be factored in before evaluating system efficiency. Typically, it can be kept under 0.5 dB per stage. FIG. 4A corresponds to a four-stage combiner circuit. The term stage as applied to the power synthesizer is used to denote one or more parallel-driven devices that output one RF bit. The n stages themselves are coherent and arranged in parallel with one another.

In the system of FIG. 4A, circuit combining accomplishes in RF, what the prior art DAC 44 does in baseband (compare FIGS. 2 and 3). The DPS approach of the present invention therefore makes a baseband DAC unnecessary. Much like in a baseband DAC, the phase on the "RF-bits" output from each amplifier 70, starting from the MSB to LSB, will switch according to the amplitude to be synthesized. Each successive RF-bit generates half the amplitude (field) produced by its preceding bit. The coherent power generated by these individual RF bits is 6 dBs apart from its neighboring bit (whereas, incoherent power is 3 dBs apart). The accuracy of RF power synthesis therefore depends on the number of such RF bits, which is also the number of separate discrete power amplifiers 70.

Figure 5:
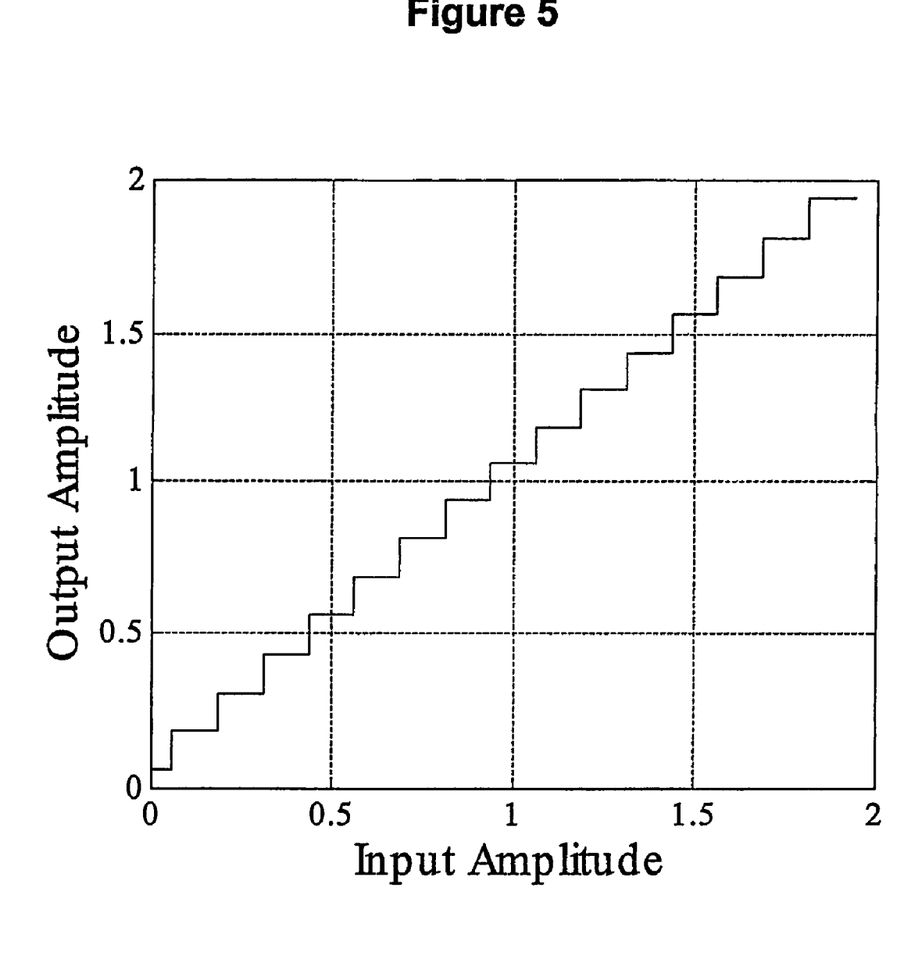
FIG. 5 is a graph showing a 16-level staircase approximation that results from the signal synthesizer shown in FIG. 1 that can be used to produce signals with up to 6 dB PAR.

The effect of discrete RF synthesis is to create a quantization effect. The number of quantization levels as well as accuracy of the process depends on number of RF-bits used. A convenient way to analyze that is to examine the quantizer transfer function for a given number of RF-bits. FIG. 5 shows the transfer function resulting from using four RF-bits as in FIG. 4A, where the input signal is assumed to have an intrinsic PAR of 6 dBs.

Figure 6:
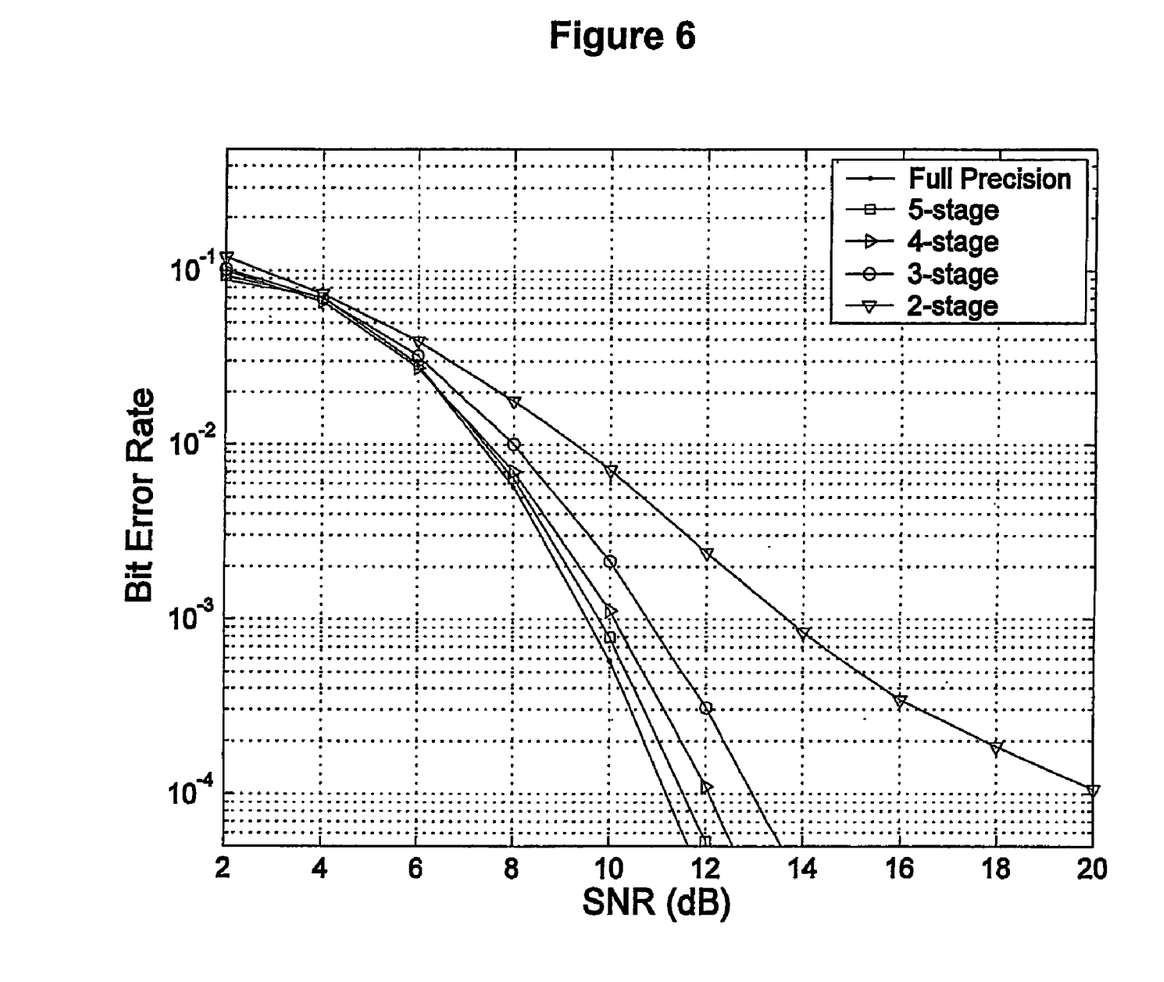
FIG. 6 is a graph showing BER performance for a QPSK modulated signal with 6 dB PAR comparing normal OFDM signal (full precision) to various implementations of a n-stage power synthesizer of the present invention, for various values of n, wherein each stage is a coherent parallel amplifier stage that may have several active devices in parallel.

FIG. 6 shows, for several different cases, a simulation of a QPSK signal (with 6 dB PAR) generated using such an RF synthesis technique, where BER is plotted as a function of SNR in AWGN. A 4-stage synthesis here corresponds to a four RF-bit system with no other impairments. It is notable from FIG. 6 that having five RF-bits closely approximates a full-precision system. The following description therefore focuses on five or more RF-bits (five or more stages 68/70). Traditional RFPAs generally do not allow dynamic ranges above three to four bits, so a five RF-bit system should yield comparable performance.

The above simulations assume uniform quantization. Since the OFDM signal has an inherent non-uniform distribution of amplitude, it is beneficial to use a predetermined non-uniform quantizer, so a five-bit RF synthesized system with non-uniform amplitude quantizers was simulated. Non-uniformity was introduced by perturbing the amplitudes emanating out of the component amplifiers 70 in the embodiment of FIG. 4A. These results, obtained by the inventors but not further elaborated herein, show that using a non-uniform quantizer yields improved BER than the uniform quantizer obtained by assuming component amplifier output powers of 0, −6, −12, −18 and −24 dB respectively. The best BER of those simulations tested appears to result from an asymmetric system.

The economics of DPS is expected to hinge on the economics of device integration and device peripheries involved, the device being the CMOS fabrication of a logical circuit component (e.g., an FET, an amplifier 70). Although it is considered easier to integrate and match impedances for RF devices at the circuit level, the following discussion considers the device level option in order to enable comparison to a single device implementation.

In the extreme case, each RF-bit may be abstracted as a single active device (e.g., each amplifier 70 is physically separate on the wafer), to make the task of phase control more manageable. Referring to FIG. 4A, such an approach would entail just four active devices 70 and four modulators 68 or phase-switches. The possibilities for phase-switches 68 are many, but using dual-gate MESFETs (DG-MESFETs) is a convenient option with similar devices being used for the amplifiers 70. The DG-MESFETs themselves can be passive or active, but more important is their switching characteristic. Switching times of 1 ns and less are achievable, so application in broadband scenarios appears feasible.

Typically, the gate length in a FET is fixed by the device process, so increasing the width W directly increases the area, to which the current, $I_d$ in a FET, is directly proportional. Since FETs are lateral devices, the current flows parallel to the surface of the die or wafer. The power delivered to the load impedance by the RFPA can be expressed as $$P = \frac{1}{2} I^2 R_L,$$

where $R_L$ is the load resistance. Assuming the load resistance is fixed, the deliverable power is proportional to the square of the increase in device surface area, A, because the producible current is directly proportional to the cross-sectional surface area A provisioned in the device. The following description therefore assumes that the discrete devices 70 are operating close to their peak ratings, and thus a device that needs to produce half the required current will be assumed to have half the required cross-sectional area.

Consider a discrete power synthesis block 62a as illustrated in FIG. 4A, with four discrete devices 70 rated to produce 0 dB, −6 dB, −12 dB and −18 dB of output power, respectively. Assuming that a device of area A is needed to produce 0 dB, then a device of area $\sqrt{2}$A is required to produce 3 dB power. By the same token, the other devices rated to operate at −6 dB, −12 dB and −18 dB would be sized at A/2, A/4 and A/8 respectively. Assume that the system specified in FIG. 4A is built to handle a peak power of 6 dB relative to the average (thus, PAR=6 dB). In other words, a prior art single-device amplifier would need to provision for a device of size 2A. In comparison, the cumulative size of the "total device" (all power amplifier devices 70) in the discrete RF power synthesis block 62a adds up to A+A/2+A/4+A/8=15A/8, which in fact is smaller than the single-device case of the prior art. The present invention not only can increase power efficiency, but also compares favorably in device periphery. In actual practice for such an approach, temperature fluctuations and gain control can be greater issues, which is another reason to favor circuit level implementation of large FET arrays.

The binary representation of OFDM data provides a new framework for power amplifier design in an OFDM modulator. While the inventive DPS concept seeks to overcome the PAR problem by providing each discrete power amplifier with constant amplitude binary input data, the task of pulse shaping waveform remains. Following are new DPS modulation formats with the constraint that transmit signal spectrum has to conform to a pre-specified spectrum emission mask and certain BER requirements. It is well known that signal amplitude and phase fluctuations are important considerations for power amplifiers that operate near the saturation region. PAM modulation formats are introduced that resemble continuous phase modulated (CPM) signals as nearly as possible. Among the different signaling formats, the Gaussian Minimum Shift Key (GMSK) family of signals appears a viable choice, which can be conveniently synthesized as PAM signals using linearized GMSK representation. Consider a PAM based OFDM transmit signal defined as, $$s(t) = \left[ \sum_{k=0}^{k=N-1} x_k p(t - kT_s) \cdot rect\left(\frac{t}{NT_s}\right) \right] \quad (4)$$

where, $$T_s = \frac{T}{N}$$

(T=OFDM symbol duration), and $x_k$ is defined as the IFFT of the input data stream $X_k$, as follows:

$$x_k = \frac{1}{\sqrt{N}} \sum_{n=0}^{n=N-1} X_n \exp\left(\frac{i2\pi nk}{N}\right) \quad (5)$$

The average power spectrum (psd) of s(t) is given by, $$S(f) = \frac{\sigma_x^2}{T_s} \left[ \sum_{k=0}^{k=N-1} |P(f - n/NT_s)|^2 \right] \otimes \left[ \frac{\sin(\pi fT)}{\pi fT} \right]^2 \quad (6)$$

The second term $$\left[ \frac{\sin(\pi fT)}{\pi fT} \right]^2$$

is contributed by time limited OFDM symbol transmission. Nevertheless, the pulse shaping waveform p(t) dictates the overall band occupancy of the PAM-OFDM signal. Examining closer the DPS version of s(t), $$s(t) \approx \sum_{j=0}^{j=n} \sum_{k=0}^{k=N-1} a_j (c_{k,j,I} + i c_{k,j,Q}) p(t - kT_s) \quad (7)$$

Equation (7) can be rewritten as $$\tilde{s}(t) = \sum_{j=0}^{j=n} a_j s_{j,I}(t) + i s_{j,Q}(t) \quad (8)$$

where $s_{j,I}(t)$ is the real part of the input signal for jth component PA, defined as, $$s_{j,I}(t) = \sum_{k=0}^{k=N-1} c_{k,j,I} p(t - kT_s)$$

Similarly, the imaginary part of s(t) is given by $$s_{j,Q}(t) = \sum_{k=0}^{k=N-1} c_{k,j,Q} p(t - kT_s)$$

Each component power amplifier is driven by a binary data stream that takes values (1,−1) with probabilities $(p_j, 1-p_j)$ respectively. $p_j$ is the probability of occurrence of jth RF bit equal to 1. $p_j$ is related to the probability distribution of $x_k$ through Equation (1). The non-uniform OFDM signal amplitudes are typically modeled as Gaussian, and hence $p_j$ is not necessarily equal to 0.5. As far as the individual PA's are concerned, the input bit probabilities are irrelevant. However, the input amplitude and phase variations are an important aspect for efficient PA operation, which is now solely dictated by the pulse shaping waveform p(t). A continuous phase and constant envelope input preferably drives each power amplifier, and yet the PAM-OFDM transmission must conform to the given bandwidth requirements. An established way to do this is by employing linearized GMSK signals.

The special properties of binary, continuous phase, constant envelope (CPM) signals, such as GMSK, are exploited in order to synthesize the desired PAM-OFDM signal of type s(t). Consider, $$s_{gmsk}(t) = e^{i\frac{\pi}{2}q(t)} \tag{9}$$

The exponent $$q(t) = \int_{-\infty}^{t} \sum_{k=-\infty}^{k=\infty} a_k g(\tau - kT_s) d\tau,$$

and g(t) is a Gaussian filtered pulse response defined as, $$g(t) = \frac{1}{T}\left[Q\left(\gamma\left(t - \frac{T_s}{2}\right)\right) - Q\left(\gamma\left(t + \frac{T_s}{2}\right)\right)\right]$$

where, $$\gamma = \frac{2\pi B}{\sqrt{\ln(2)}},$$

B is the bandwidth of the Gaussian filter, and $$Q(x) \cong \frac{1}{\sqrt{2\pi}} \int_{x}^{\infty} e^{\frac{u^2}{2}} du.$$

Laurent's decomposition [P. A. Laurent, "*Exact and approximate construction of digital phase modulations by superposition of amplitude modulated pulses*", IEEE TRANS. COMMS., VOL. COM-34 No. 2, pp 150-160 (1986)], allows GMSK type CPM signals to be expressed as a sum of several PAM signals.

For the special case of GMSK, it is possible to approximate $s_{gmsk}(t)$, with good accuracy, as an equivalent PAM signal, $$s_{1gmsk}(t) = \sum_{k=-\infty}^{k=\infty} i^{a_k} a_{k-1} p_0(t - kT_s) \tag{10}$$

where, the information symbols $a_k$ are encoded by the differential encoding operation $a_k = i^{a_k} a_{k-1}$. The principal pulse $p_0$ (t) is the main pulse in Laurent's' decomposition, which typically carries about 99% of signal energy.

The principal pulse is given by $$p_0(t) = \begin{cases} \prod_{k=1}^{k=L} c(t - kT_s) & t \in [0, (L+1)T_s] \\ 0 & \text{otherwise} \end{cases}$$

-continued $$c(t) = \begin{cases} \cos\left(-\frac{\pi}{2}q(t)\right) & t \in [0, LT_s] \\ c(-t) & t \in [-LT_s, 0] \\ 0 & |t| \geq LT_s \end{cases}$$

For the special case of MSK, $p_0(t)$ takes the familiar form, $$p_0(t) = \begin{cases} \cos\left(-\frac{\pi t}{2T_s}\right) & t \in [-LT_s, LT_s] \\ & \text{otherwise} \end{cases}$$

Linearized GMSK differs from conventional PAM signals in two ways: the time varying phase $i^{a_k}$ ensures phase continuity at symbol boundaries; and the principal GMSK pulse $p_0(t)$ maintains constant envelope feature to high accuracy, at any given time instant t. At the receiver, a differential decoding operation recovers the information sequence $a_k$. In order to utilize GMSK signaling in the DPS framework, a differentially pre-coded version of the GMSK signal is likely required. The precoding operation results in a simplified model suitable for the signal under consideration (especially, for detection and demodulation purposes). If the input symbols $a_k$ are already precoded according to the rule $a_k = a_k a_{k-1}$, then the linearized GMSK signal can be equivalently represented as, $$s_{1gmsk}(t) = \sum_{k=0}^{k=N-1} i^k a_k p_0(t - kT_s) \tag{11}$$

The above signal model therefore is well suited to the DPS framework of FIGS. 4A-4B. To summarize the proposed signaling scheme, Quantize the IFFT complex signal amplitudes into a bank of parallel PA stages each with binary amplitude input Differentially encode the input data on each PA stage Utilize linearized GMSK transmission on each PA according to Equation (10)

Following the above three steps, the GMSK-OFDM transmission results as follows:

$$s(t) \approx \sum_{j=0}^{j=n} \sum_{k=0}^{k=N-1} a_j i^k (c_{k,j,I} + ic_{k,j,Q}) p(t - kT_s) \tag{12}$$

This is a synthesized PAM-OFDM signal $\tilde{s}(t)$, which is similar to the intended transmission s(t), with the exception of a time-varying phase $i^k$. At the receiver, signal de-rotation by a factor $i^{-k}$, recovers the IFFT amplitude sequence $x_k$.

GMSK has the ability to provide fine trade-off between band occupancy and ISI. The Gaussian filter bandwidth-time product, denoted as $BT_s$, determines the modulation properties. Small values of $BT_s$ lead to a narrow spectral footprint, but at the same time introduces severe ISI. The receiver should be able to cope with the induced ISI, without severely amplifying noise in the equalizer. Typically, $BT_s$ values in the range of 0.16-0.3 are preferred. The symbol-spaced impulse response of linearized GMSK pulse, for various $BT_s$ values is given below.

$$p_{lg\,msk}(t) = \begin{cases} \{0.026, 0.39, 0.81, 0.39, 0.026\} & BT_s = 0.16 \\ \{0.01, 0.35, 0.86, 0.35, 0.01\} & BT_s = 0.2 \\ \{0.0007, 0.26, 0.93, 0.26, 0.0007\} & BT_s = 0.3 \\ \{0, 0, 1, 0, 0\} & BT_s = \infty(MSK) \end{cases}$$

The ISI channel is three-taps long for $BT_s$=0.3, compared to MSK which is ISI-free. The central tap carries about 86% of the energy and the remaining two taps account for the remaining 14% of the energy. The ISI channel for $BT_s$=0.16 is five-taps long, with 64% energy in the central tap and the remaining 36% dispersed in remaining four-taps. An appropriately designed OFDM equalizer should be able to compensate for the ISI introduced by the pulse. While MSK and rectangular pulses have high side lobes, the out of band power for GMSK can be made as low as desired, depending on the choice of $BT_s$ used.

The discrete RF power synthesis invention presented herein can enable higher efficiency design, with moderate efforts devoted to corresponding RF circuit design. The higher PAR that this invention makes possible is an added incentive towards enhancing performance of mobile multi-carrier systems. The achievable PAR would be limited only by the number of discrete stages in the synthesis.

Although described in the context of particular embodiments, it will be apparent to those skilled in the art that a number of modifications and various changes to these teachings may occur. Thus, while the invention has been particularly shown and described with respect to one or more preferred embodiments thereof, it will be understood by those skilled in the art that certain modifications or changes, in form and shape, may be made therein without departing from the scope and spirit of the invention as set forth above.

What is claimed is:

1. A power synthesizer comprising a plurality of n stages in parallel with one another, wherein n is an integer at least equal to two, each of the n stages comprising:
 a modulator and a discrete amplitude amplifier in series with one another,
 each $n^{th}$ discrete amplitude amplifier configured to apply a gain that is unique as compared to all other of the discrete amplitude amplifiers; and
 a common actuator configured to simultaneously switch the n modulators, wherein
 each of the modulators is coupled to the common actuator, and
 each $n^{th}$ discrete amplitude amplifier is configured to output a signal amplitude $a_0/2^{n-1}$, where $a_0$ is a maximum signal amplitude output by any of said n discrete amplitude amplifiers;
 the power synthesizer further comprises a discrete amplitude generator configured to convert a real valued input to a first and second parallel binary outputs that are each coupled to an input of a respective one of the n modulators.

2. The power synthesizer of claim 1 wherein each of the n discrete amplifiers comprises a constant envelope amplifier.

3. The power synthesizer of claim 1 wherein each of the n modulators comprises a continuous phase modulator.

4. The power synthesizer of claim 1 wherein each of the n modulators comprises a pulse-amplitude modulator.

5. The power synthesizer of claim 1 further comprising a power combiner having parallel inputs coupled to outputs of the n discrete amplitude amplifiers.

6. The power synthesizer of claim 1, wherein for each of the n stages, the discrete amplitude amplifier of the $n^{th}$ stage has an input that is directly coupled to an output of the modulator of the $n^{th}$ stage.

7. The power synthesizer of claim 1, wherein each of the n stages has an output coupled to an input of a separate transmit antenna.

8. The power synthesizer of claim 1 disposed within a mobile station, further comprising an inverse fast fourier transform IFFT block, said IFFT block configured to convert an amplitude modulated input to a bit modulated output.

9. The power synthesizer of claim 1 wherein each discrete amplitude amplifier applies a gain that differs from that applied by another nearest-gain discrete amplitude amplifier by a fixed amount.

10. The power synthesizer of claim 9 wherein the fixed amount is about 6 dB.

11. A power synthesizer comprising a plurality of n stages in parallel with one another, wherein n is an integer at least equal to two, each of the n stages comprising:
 a modulator and a discrete amplitude amplifier in series with one another,
 each $n^{th}$ discrete amplitude amplifier configured to apply a gain that is unique as compared to all other of the discrete amplitude amplifiers; and
 an actuator configured to simultaneously switch the n modulators, wherein, in one stage, the discrete amplitude amplifier comprises x FETs each having a drain and a gate, and in another stage, the discrete amplitude amplifier comprises x/2 FETs each having a drain and a gate, wherein x is an even integer greater than two, wherein the drains of the x FETs of the discrete amplitude amplifier of the one stage are coupled in parallel, and wherein the gates of the x/2 FETs of the discrete amplifier of the another stage are coupled in parallel.

12. An apparatus comprising, in series: an encoder, a serial to parallel converter, and a parallel to serial converter configured to output a digital signal at baseband, the apparatus further comprising:
 a power synthesizer block comprising n discrete amplifier stages in parallel, wherein each discrete amplifier stage comprises a discrete amplitude amplifier configured to apply a gain that differs from that applied by each other discrete amplitude amplifier of each other discrete amplifier stage, wherein n is an integer of at least 2 and each $n^{th}$ discrete amplifier stage comprises a modulator,
 each of the modulators is connected to a common actuator; and
 each of the $n^{th}$ discrete amplitude amplifiers is configured to output a signal amplitude $a_0/2^{n-1}$, where $a_0$ is a maximum signal amplitude output by any of said n discrete amplitude amplifiers, and where
 the power synthesizer block further comprises a discrete amplitude generator configured to convert a real valued input to a first and second parallel binary outputs that are each coupled to an input of a respective one of the n modulators.

13. The apparatus of claim 12, wherein each of the n discrete amplifier stages comprises a discrete amplitude amplifier and a modulator in series with one another.

14. The apparatus of claim 13, further comprising an inverse fast fourier transform IFFT block disposed between the serial to parallel converter and the parallel to serial converter, the discrete amplitude generator configured to convert a real valued output from the IFFT block to parallel binary outputs.

15. The apparatus of claim 12, wherein the power synthesizer block further comprises at least one power combiner configured to couple an output of each of the n discrete amplifier stages with at least one transmit antenna.

16. The apparatus of claim 12, wherein each of the modulators comprises a continuous phase modulator.

17. The apparatus of claim 12, wherein each of the discrete amplitude amplifiers comprises a constant envelope amplifier.

18. The apparatus of claim 15, wherein each output of the n discrete amplifier stages is coupled to an input of an antenna.

19. The apparatus of claim 12, disposed within a mobile station or a base station.

20. The apparatus of claim 12, wherein each discrete amplitude amplifier is configured to apply a gain that differs by a fixed amount from that applied by its nearest-gain neighbor discrete amplitude amplifier.

21. The apparatus of claim 20, wherein the fixed amount is about 6 dB.

22. The apparatus of claim 12 wherein, in one discrete amplifier stage, the discrete amplitude amplifier comprises x FETs each having a drain and a gate, and in another discrete amplifier stage, the discrete amplitude amplifier comprises x/2 FETs each having a drain and a gate, wherein x is an even integer greater than two, wherein the drains of the x FETs of the discrete amplitude amplifier of the one discrete amplifier stage are coupled in parallel, and wherein the gates of the x/2 FETs of the discrete amplifier of the another discrete amplifier stage are coupled in parallel.

23. The apparatus of claim 12 comprising at least one transmit antenna.

24. A method comprising:
converting a real valued input to a bit stream;
providing a separate bit of the bit stream on each of n parallel inputs wherein each bit of the bit stream represents a different significance;
for each of the n parallel inputs, performing phase modulation according to the input bit and amplifying the phase modulated bit by an $n^{th}$ discrete amplitude amplifier having a power that is unique respecting all other n parallel inputs; and
combining all n phase modulated and amplified bits in one of a spatial transmission manner and a circuit manner, wherein the phase modulation is controlled by a common actuator; and each $n^{th}$ discrete amplitude amplifier is adapted to output a signal amplitude $a_0/2^{n-1}$, where $a_0$ is a maximum signal amplitude output by any of said discrete amplitude amplifiers.

25. The method of claim 24, wherein combining all amplified and phase controlled bits comprises simultaneously transmitting at least two separately amplified and phase controlled bits by separate transmit antennas.

26. The method of claim 24, wherein phase modulating an input bit comprises spectrally shaping the input bit with a continuous phase modulator.

27. The method of claim 26 wherein the continuous phase modulator comprises a pulse amplitude modulator.

28. The method of claim 26 wherein the continuous phase modulator approximately performs Gaussian minimum shift keying.

29. The method of claim 26 wherein the real valued input is an amplitude modulated signal.

30. The method of claim 24, wherein combining the phase modulated and amplified bits in a circuit manner comprises combining all of the n phase modulated and amplified bits with at least one power combiner prior to transmission.

31. The method of claim 24, wherein amplifying each phase modulated bit at a power that is unique respecting all other n parallel inputs comprises, for each of the n parallel inputs, amplifying with a power that differs by a fixed amount from a next nearest power amplification.

32. The method of claim 31, wherein the fixed amount is about 6 dB.

33. The apparatus of claim 12, further comprising an absence of a digital to analog converter disposed between the parallel to serial converter and the power synthesizer block.

34. A method comprising:
providing a separate bit of a bit stream on each of n parallel inputs wherein each bit of the bit stream represents a different significance;
for each of the n parallel inputs, performing phase modulation according to the input bit and amplifying the phase modulated bit by an $n^{th}$ discrete amplitude amplifier having a power that is unique respecting all other n parallel inputs; and
combining all n phase modulated and amplified bits in one of a spatial transmission manner and a circuit manner, wherein one of the n discrete amplitude amplifiers comprises x FETs each having a drain and a gate, and an other of the n discrete amplitude amplifiers comprises x/2 FETs each having a drain and a gate, wherein x is an even integer greater than two, wherein the drains of the x FETs of the discrete amplitude amplifier of the one stage are coupled in parallel, and wherein the gates of the x/2 FETs of the discrete amplifier of the another stage are coupled in parallel.

* * * * *